United States Patent [19]
Iwamuro

[11] Patent Number: 5,684,306
[45] Date of Patent: Nov. 4, 1997

[54] INSULATED GATE THYRISTOR

[75] Inventor: Noriyuki Iwamuro, Nagano, Japan

[73] Assignee: Fuji Electric Co., Ltd., Japan

[21] Appl. No.: 626,334

[22] Filed: Apr. 2, 1996

[30] Foreign Application Priority Data

Apr. 3, 1995 [JP] Japan ............................. 7-077531

[51] Int. Cl.$^6$ .......................... H01L 29/74; H01L 31/111
[52] U.S. Cl. ............................ 257/147; 257/152; 257/155
[58] Field of Search .................................. 257/133, 140, 257/147, 152, 153, 163, 164, 155

*Primary Examiner*—Wael Fahmy
*Attorney, Agent, or Firm*—Rossi & Associates

[57] ABSTRACT

An insulated gate thyristor is provided which includes a first-conductivity-type base layer having a high resistivity, a first and a second second-conductivity-type base region separately formed in a surface layer of the first-conductivity-type base layer, a first-conductivity-type source region formed in a surface layer of the first second-conductivity-type base region, and a first-conductivity-type emitter region formed in a surface layer of the second second-conductivity-type base region. A gate electrode is formed through an insulating film on exposed portions of the first second-conductivity-type base region, the first-conductivity-type base layer, and the second second-conductivity-type base region, which exposed portions are interposed between the first-conductivity-type source region and the first-conductivity-type emitter region. A first main electrode is held in contact with both the first second-conductivity-type base region and the first-conductivity-type source region. A first-conductivity-type semiconductor film is interposed between and held in contact with the first main electrode and an exposed portion of the second second-conductivity-type base region, to cooperate with the second second-conductivity-type base region to form a diode. A second-conductivity-type emitter layer is formed on the other surface of the first-conductivity-type base layer, and a second main electrode is held in contact with the second-conductivity-type emitter layer.

9 Claims, 7 Drawing Sheets

INSULATED GATE THYRISTOR

FIELD OF THE INVENTION

The present invention relates in general to an insulated gate thyristor. More specifically, the invention relates to an insulated gate thyristor used as a power switching device.

BACKGROUND OF THE INVENTION

Thyristors have been used as indispensable devices for large capacity power switching owing to their low ON-state voltage characteristics. For example, GTO (gate turn-off) thyristors are widely used these days in high-voltage large-current range applications. The GTO thyristor, however, has revealed drawbacks as follows: first, the GTO thyristor requires large gate current for turn-off, in other words, the thyristor has a relatively small turn-off gain; and secondly, it requires a large-sized snubber is needed to safely turn off the GTO thyristor. In addition, since the GTO thyristor does not show current saturation in its current-voltage characteristics, a passive component, such as a fuse, must be coupled to the thyristor so as to protect its load from short-circuiting. This greatly impedes the reduction in the size and cost of the whole system.

AMOS controlled thyristor (MCT) as a voltage-driven type thyristor was disclosed by V. A. K. Temple in IEEE IEDM Tech. Dig., 1984, p 282. Since then, the characteristics of this type of thyristor have been analyzed and improved in various institutions worldwide. This is because the MCT, which is a voltage-driven type of device, requires a far simpler gate circuit than the GTO thyristor, while assuring a relatively low ON-state voltage characteristic. The MCT, however, does not show a current saturation characteristic, like the GTO thyristor, and therefore requires a passive component, such as a fuse, in its practical use.

M. S. Shekar and others proved through actual measurements in IEEE Electron Device Letters vol. 12 (1991), p 387, that a dual channel type emitter switched thyristor (EST-1) shows a current saturation characteristic even in a high voltage range. In Proceedings of IEEE ISPSD '93, p 71 and Proceedings of IEEE ISPSD '94, p 195, the inventors of the present invention disclosed results of their analysis with regard to a forward bias safe operation area (FBSOA) and a reverse bias safe operation area (RBSOA) of the EST, and paved the way to development of a device having the safe operation area in which the device operates safely even when a load is short-circuited. FIG. 14 shows the structure of this EST device.

In the device as shown in FIG. 14, a first p base region 4, a $p^+$ well region 5 and a second p base region 6 are formed in a surface layer of an n base layer 3 deposited on a p emitter layer 1 through an $n^+$ buffer layer 2. The $p^+$ well region 5 forms a part of the first p base layer 4, and has a relatively large diffusion depth. An n source region 7 is formed in a surface layer of the first p base region 4, and an n emitter layer 8 is formed in a surface layer of the second p base region 6. A gate electrode 10 is formed through a gate oxide film 9 over a portion of the first p base region 4 that is interposed between the n source region 7 and an exposed portion of the n base layer 3, and a portion of the second p base region 6 that is interposed between the n emitter region 8 and the exposed portion of the n base layer 3. The length of each of the n source region 7, n emitter region 8 and the gate electrode 10 is limited in the Z direction of FIG. 14, and the first p base region 4 and the second p base region 6 are connected to each other outside these regions 7, 8 and electrode 10. Further, the L-shaped $p^+$ well region 5 is formed outside the connected portion of the first and second p base regions 4, 6. A cathode 11 is formed in contact with both a surface of the $p^+$ well region 5, and a surface of the n source region 7. On the other hand, an anode 12 is formed over the entire area of the rear surface of the p emitter layer 1.

When the cathode 11 of this device is grounded, and positive voltage is applied to the gate electrode 10 while the anode 12 is biased positive, an inversion layer (partial accumulation layer) is formed under the gate oxide film 9, and a lateral MOSFET is thus turned on. As a result, electrons are fed from the cathode 11 to the n base layer 3, through the n source region 7, and a channel formed in a surface layer of the first p base region 4. These electrons function as a base current for a pnp transistor, which consists of the p emitter layer 1, the $n^+$ buffer layer 2 and n base layer 3, and the first and second p base regions 4, 6 and $p^+$ well region 5. This pnp transistor is operated with this base current. Part of holes injected from the p emitter layer 1 flow toward the second p base region 6, through the $n^+$ buffer layer 2 and n base layer 3, and then flow under the n emitter region 8 in the Z direction to the cathode 11. Thus, the device operates in an IGBT (insulated gate bipolar transistor) mode. With a further increase in the current, the pn junction between the n emitter region 8 and the second p base region 6 is forward biased, a built-in thyristor consisting of the p emitter layer 1, $n^+$ buffer layer 2, n base layer 3, second p base region 6 and the n emitter region 8 latches up. To turn off the EST, the MOSFET is switched off by lowering the potential of the gate electrode 10 below the threshold of the lateral MOSFET. As a result, the n emitter region 8 is potentially separated from the cathode 11, so that the operation of the thyristor is stopped.

Since the holes flowing in the second p base region 6 in the Z direction are utilized to forward bias the pn junction between the second p base region 6 and the n emitter region 8, a degree or strength (depth) of the forward bias decreases in the Z direction toward a contact area of the second p base region 6 with the cathode 11. Namely, the amount of electrons injected from the n emitter region 8 is not uniform over the length of the pn junction in the Z direction. If this EST is switched from this ON-state to the OFF-state, a shallow or weakly biased portion of the pn junction near the contact area with the cathode 11 initially resumes its reverse-blocking ability, and a deeply biased portion of the junction remote from the contact area with the cathode 11 slowly resumes the same ability. This tends to cause current localization or concentration, resulting in reduced breakdown withstand capability of the EST at the turn-off time.

FIGS. 15 and 16 show improved ESTs as disclosed in U.S. Pat. Nos. 5,317,171 issued on May 31, 1994 and 5,319,222 issued on Jun. 7, 1994 to M.S. Shekar et al. Although the EST shown in FIG. 15 operates in the same manner as the EST of FIG. 14, the EST of FIG. 15 can be turned off more rapidly due to direct contact of the cathode 11 extending in the Y direction, with a surface of the second p base region 6. Further, the EST of FIG. 15 shows a uniform turn-off characteristic due to the absence of the hole current flowing in the Z direction. In the operation of this thyristor, however, the minority carriers are not uniformly injected along the horizontal direction (Y direction) when the pn junction between the n emitter region 8 and the second p base region 6 is turned on or forward biased, and therefore the ON-state voltage cannot be lowered to such an extent as expected. If the impurity concentration of the second p base region 6 is reduced to increase its resistance, for example, so as to solve this problem, a depletion layer is punched through the n emitter region 8 upon withstanding of the voltage applied in the forward direction. Thus the conventional EST cannot achieve a sufficient withstand voltage.

In the device shown in FIG. 16, the n emitter region 8 extends beyond the second p base region 6 so as to further lower the ON-state voltage. This structure, however, is unable to withstand the voltage applied in the forward direction.

In the EST in which an IGBT and a thyristor are considered to be connected in parallel with each other, the ON-state voltage decreases with an increase in the ratio of the area of the thyristor to that of the IGBT. The ON-state voltage also decreases with an increase in the current amplification factor of an npn transistor of the thyristor.

It is therefore an object of the present invention to provide an insulated gate thyristor wherein the pn junction can uniformly resumes its reverse-blocking ability upon turn off of the thyristor, to enhance the turn-off withstand capability, while assuring a sufficiently small ON-state voltage.

SUMMARY OF THE INVENTION

The above object may be accomplished according to a first aspect of the present invention, which provides an insulated gate thyristor comprising: a first-conductivity-type base layer having a high resistivity; a first and a second second-conductivity-type base region formed in spaced-apart selected areas of a surface layer of one of major surfaces of the first-conductivity-type base layer; a first-conductivity-type source region formed in a selected area of a surface layer of the first second-conductivity-type base region; a first-conductivity-type emitter region formed in a selected area of a surface layer of the second second-conductivity-type base region; a gate electrode formed through an insulating film on exposed portions of the first second-conductivity-type base region, the first-conductivity-type base layer, and the second second-conductivity-type base region, the exposed portions being interposed between the first-conductivity-type source region and the first-conductivity-type emitter region; a first main electrode held in contact with both an exposed portion of the first second-conductivity-type base region and the first-conductivity-type source region; a first-conductivity-type semiconductor film interposed between and held in contact with the first main electrode and an exposed portion of the second second-conductivity-type base region, the first-conductivity-type semiconductor film cooperating with the second second-conductivity-type base region to form a diode; a second-conductivity-type emitter layer formed on the other of the major surfaces of the first-conductivity-type base layer; and a second main electrode held in contact with the second-conductivity-type emitter layer.

The above-described object may also be accomplished according to a second aspect of the present invention, which provides an insulated gate thyristor comprising: a first-conductivity-type base layer having a high resistivity; a first and a second second-conductivity-type base region formed in spaced-apart selected areas of a surface layer of one of major surfaces of the first-conductivity-type base layer; a first-conductivity-type source region formed in a selected area of a surface layer of the first second-conductivity-type base region; a first-conductivity-type emitter region formed in a selected area of a surface layer of the second second-conductivity-type base region; a gate electrode formed through an insulating film on exposed portions of the first second-conductivity-type base region, the first-conductivity-type base layer, and the second second-conductivity-type base region, the exposed portions being interposed between the first-conductivity-type source region and the first-conductivity-type emitter region; a first main electrode held in contact with both an exposed portion of the first second-conductivity-type base region and the first-conductivity-type source region; a second-conductivity-type semiconductor film held in contact with an exposed portion of the second second-conductivity-type base region; a first-conductivity-type semiconductor film interposed between and held in contact with the second-conductivity-type semiconductor film and the first main electrode, the first-conductivity-type semiconductor film cooperating with the second-conductivity-type semiconductor film to form a diode; a second-conductivity-type emitter layer formed on the other of the major surfaces of the first-conductivity-type base layer; and a second main electrode held in contact with the second-conductivity-type emitter layer.

In one preferred form of either of the first and second aspects of the invention, a contact area between the second second-conductivity-type base region and the second-conductivity-type semiconductor film has one of polygonal, circular and elliptical shapes.

In another preferred form of the invention, the first-conductivity-type semiconductor film and the second-conductivity-type semiconductor film are formed of polycrystalline silicon.

In a further preferred form of the invention, a contact area between the first main electrode, and the first second-conductivity-type base region and the first-conductivity-type source region has one of polygonal, circular and elliptical shapes.

According to the first aspect of the present invention, the first-conductivity-type semiconductor film, which is interposed between and held in contact with the main electrode and the exposed portion of the second second-conductivity-type base region, cooperates with the second second-conductivity-type base region to form a diode. In this arrangement, about 0.7V of a diffusion potential difference of the diode arises between the second second-conductivity-type base region and the first-conductivity-type semiconductor film, and electrons are injected from the first-conductivity-type emitter region due to the potential difference. Thus, this device does not require the hole current flowing in the Z direction in the second second-conductivity-type base region as in the conventional EST as described above. With the electrons uniformly injected from the entire length of the first-conductivity-type emitter region, the present device can be rapidly shifted to its thyristor mode, assuring reduced ON-state voltage. Upon turn-off of the device, the pn junction can uniformly resume its reverse-blocking ability, due to the potential difference, thus avoiding current localization or concentration.

According to the second aspect of the invention, the second-conductivity-type semiconductor film is held in contact with the exposed portion of the second second-conductivity-type base region, and the first-conductivity-type semiconductor film, which is interposed between and held in contact with the the second-conductivity-type semiconductor film and the first main electrode, cooperates with the second-conductivity-type semiconductor film to form a diode having a diffusion potential difference as described above.

In either case, the shapes of the contact area between the second second-conductivity-type base region and the first-conductivity-type semiconductor film, the contact area between the second second-conductivity type base region and the second-conductivity-type semiconductor film, and the contact area between the first main electrode, and the first second-conductivity-type base region and first-conductivity-type source region may be advantageously selected from polygonal, circular and elliptical shapes. In this case, the semiconductor substrate can be utilized with improved efficiency, and the current is uniformly distributed within the device, assuring improved thermal balance.

If a resistor is formed of polycrystalline silicon, it can be easily formed, and has good compatibility with phosporus glass, a cathode, and a surface of a semiconductor substrate, and its resistivity can be adjusted as desired.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Figure 14:
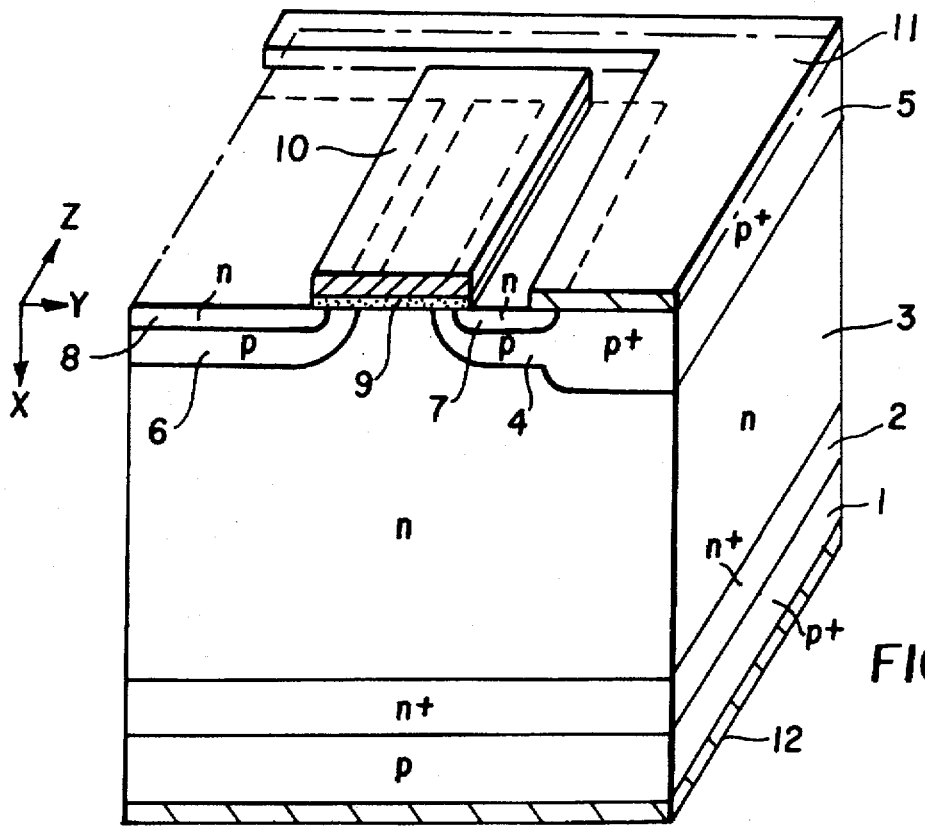
FIG. 14 is a perspective view in cross section, showing an EST (Emitter Switched Thyristor)

There will be described some embodiments of the present invention, referring to the drawings in which the same reference numerals as used in FIG. 14 are used to identify structurally and/or functionally corresponding elements. While the first conductivity type is n type and the second conductivity type is p type in the following embodiments, the first and second conductivity types may be p type and n type, respectively.

Figure 1:
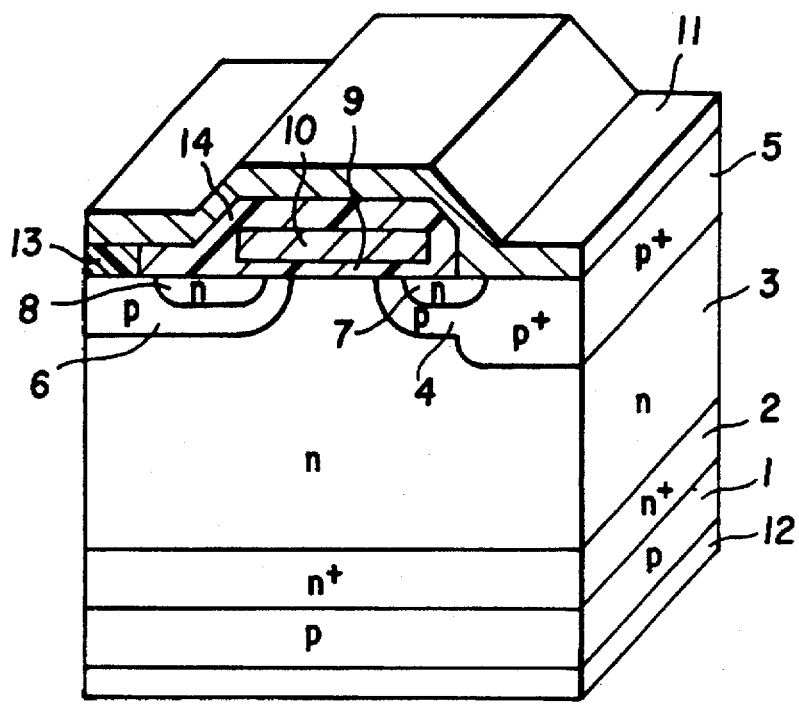
FIG. 1 is a perspective view in cross section, showing an insulated gate thyristor of the first embodiment of the present invention.

FIG. 1 is a perspective view in cross section, showing an insulated gate thyristor as the first embodiment of the present invention. This figure only shows a part of an active region of the thyristor assigned to perform switching of electric current, and a plurality of units are integrated by repeatedly reversing one unit as shown in FIG. 1, to thereby provide a semiconductor device. The insulated gate thyristor further includes a peripheral portion that contributes to withstanding voltage, as well as the active region as shown in the figure. The peripheral portion is not related to the principle of the present invention, and therefore will not be described in detail nor shown in the figure.

The insulated gate thyristor of FIG. 1 has a semiconductor substrate portion which is similar in construction to that of the EST of FIG. 14. Specifically, a first p base region 4 and a second p base region 6 are formed in a surface layer of an n base layer 3 having a relatively high resistivity. Further, a $p^+$ well region 5 is formed in a part of the first p base region 4 so as to avoid latch-up of a parasitic thyristor. A p emitter layer 1 is formed on the other surface of the n base layer 3, through an $n^+$ buffer layer 2 having a higher impurity concentration than the n base layer 3. An n source region 7 is formed in a surface layer of the first p base region 4, and an n emitter region 8 is formed in a surface layer of the second p base region 6. As in the thyristor of FIG. 14, a gate electrode 10 is formed through a gate oxide film 9 over the first p base region 4, n base layer 3 and second p base region 6, which are interposed between the n source region 7 and the n emitter region 8, to thereby provide an n-channel lateral MOSFET. A surface of the MOSFET on the side of the gate electrode 10 is covered with an insulating film 14 made of phosphorus glass (PSG), through which film is formed a contact hole. A polycrystalline silicon film 13 is deposited on the insulating film 14, and heat-treated, such that the film 13 contacts the second p base region 6 through the contact aperture. A cathode 11 is provided to cover the insulating film 14 and the polycrystalline silicon film 13.

Figure 2:
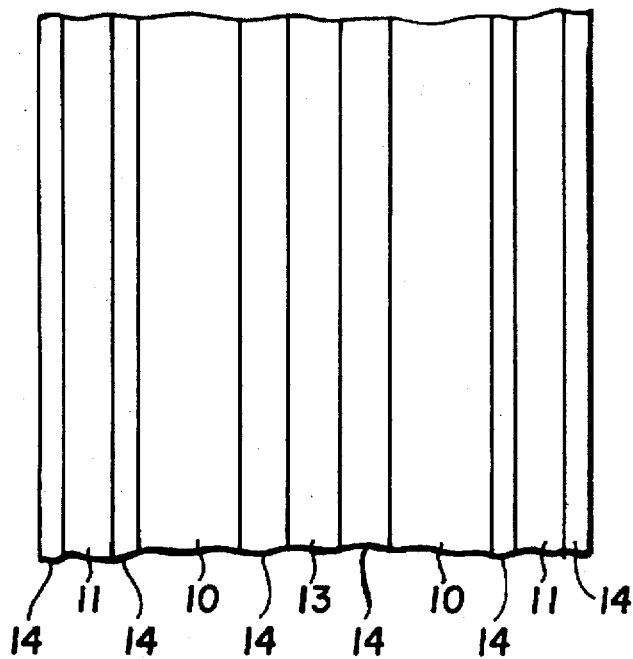
FIG. 2 is a cross sectional view taken along a horizontal plane extending through the middle of gate electrodes of the insulated gate thyristor FIG. 1.

FIG. 2 is a cross sectional view taken in a horizontal plane extending through the middle of gate electrodes 10 of a plurality of cells (each of which is shown in FIG. 1) constituting the MOSFET. In FIG. 2, the same reference numerals as used in FIG. 1 are used to identify corresponding elements. It is to be noted that the cathodes 11, gate electrodes 10, polycrystalline silicon film 13, and insulating films 14 that separate these elements 11, 10, 13 from each other are all arranged in the form of stripes.

There will be next described an operation of the insulated gate thyristor constructed as described above. When the cathode 11 is grounded, and positive voltage is applied to the gate electrode 10 while the anode 12 is biased positive, an inversion layer (partial accumulation layer) is formed under the gate oxide film 9, and the lateral MOSFET is thus turned on. As a result, electrons are initially fed from the cathode 11 to the n base layer 3, through the n source region 7, and a channel of the MOSFET formed in a surface layer of the first p base region 4. These electrons function as a base current for a pnp transistor, which consists of the p emitter layer 1, the n⁺ buffer layer 2 and n base layer 3, and the p base regions 4, 6 and p⁺ well region 5. This pnp transistor is operated with this base current. Part of holes emitted from the p emitter layer 1 flow toward the second p base region 6, through the n⁺ buffer layer 2 and n base layer 3. The holes then pass through the polycrystalline silicon film 13 to reach the cathode 11. To allow the hole current to pass through the polycrystalline silicon film 13, the hole current needs to exceed a diffusion potential of a diode formed by the second p base region 6 and the n type polycrystalline silicon film 13. As a result, electrons are injected from the n emitter region 8, whereby the thyristor consisting of the p emitter layer 1, n⁺ buffer layer 2 and n base layer 3, second p base region 6, and n emitter region 8 is operated.

Upon turn-off, the potential of the gate electrode 10 is lowered below the threshold of the lateral MOSFET, to turn off this MOSFET, so that the n emitter region 8 is electrically separated from the cathode 11, and the thyristor stops operating. The insulated gate thyristor of FIG. 1 is different from that of FIG. 14 in that the thyristor of FIG. 1 includes the second p base region 6 and the n type polycrystalline silicon film 13 which are in contact with each other and constitute a diode. With this diode provided, about 0.7V of a diffusion potential difference of the diode arises between the second p base region 6 and the n type polycrystalline silicon film 13, and this potential difference causes electrons to be injected from the n emitter region 8. Thus, the present thyristor does not require the hole current flowing through the second p base region in the Z direction as in the conventional EST, and permits rapid transition from the IGBT mode to the thyristor mode. Further, the ON-state voltage is lowered since the electrons are uniformly injected from the whole n emitter region 8. Upon turn-off, on the other hand, the pn junction between the n emitter region 8 and the second p base region 6 can uniformly resume its reverse-blocking ability, due to the potential difference, and the current does not concentrate in any limited area, in other words, current localization or concentration can be avoided, with a result of a significantly increased reverse bias safe operation area (RBSOA).

Figure 6:
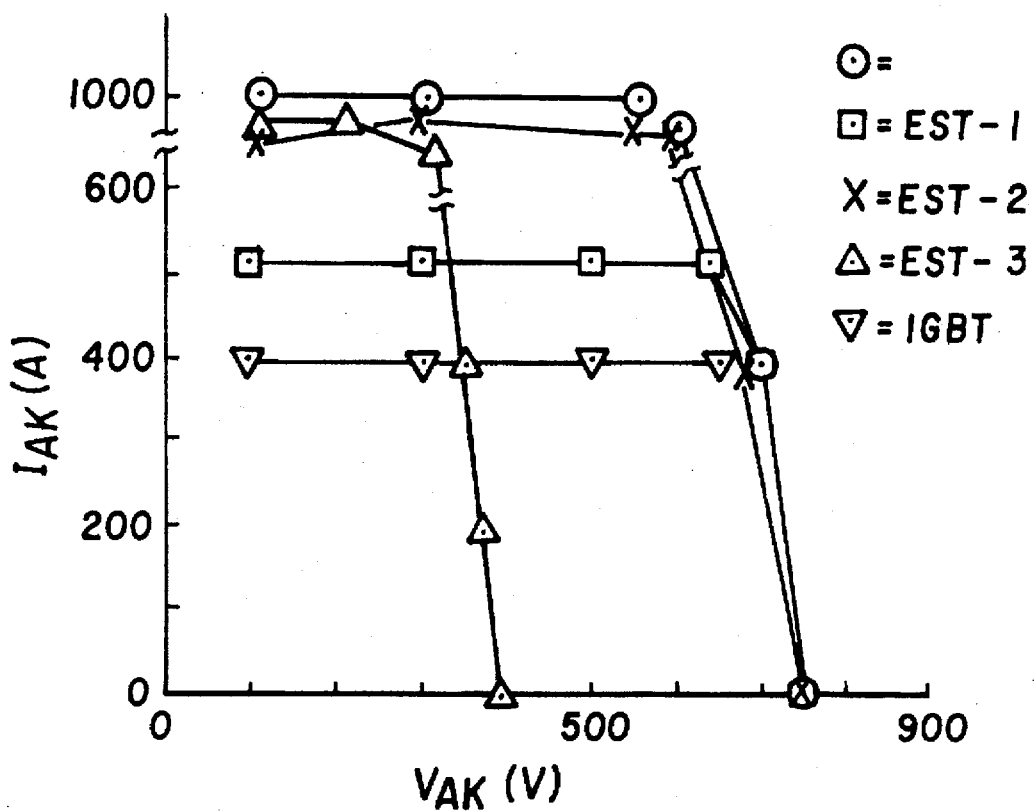
FIG. 6 is a graph showing the RBSOAs of 600V-class devices according to the first embodiment of the present invention and comparative examples.
Figure 7:
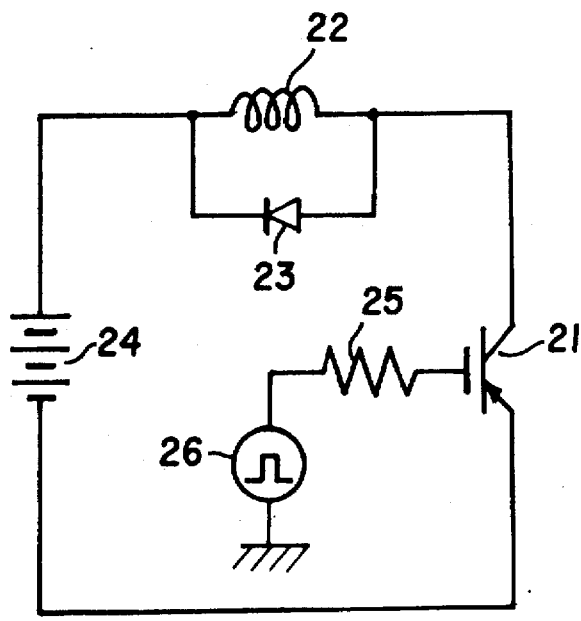
FIG. 7 is a circuit diagram for measuring the RBSOA.
Figure 15:
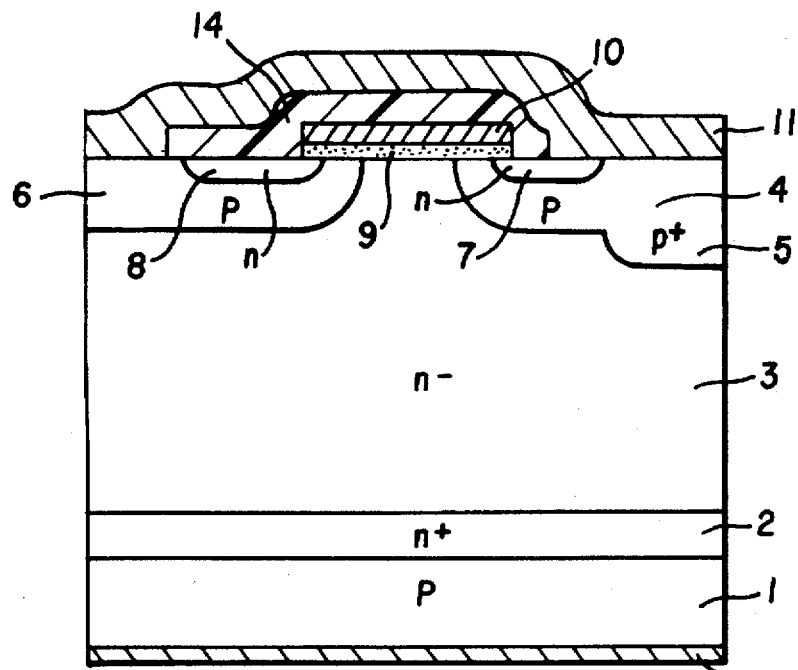
FIG. 15 is a fragmentary cross sectional view showing an improved EST.
Figure 16:
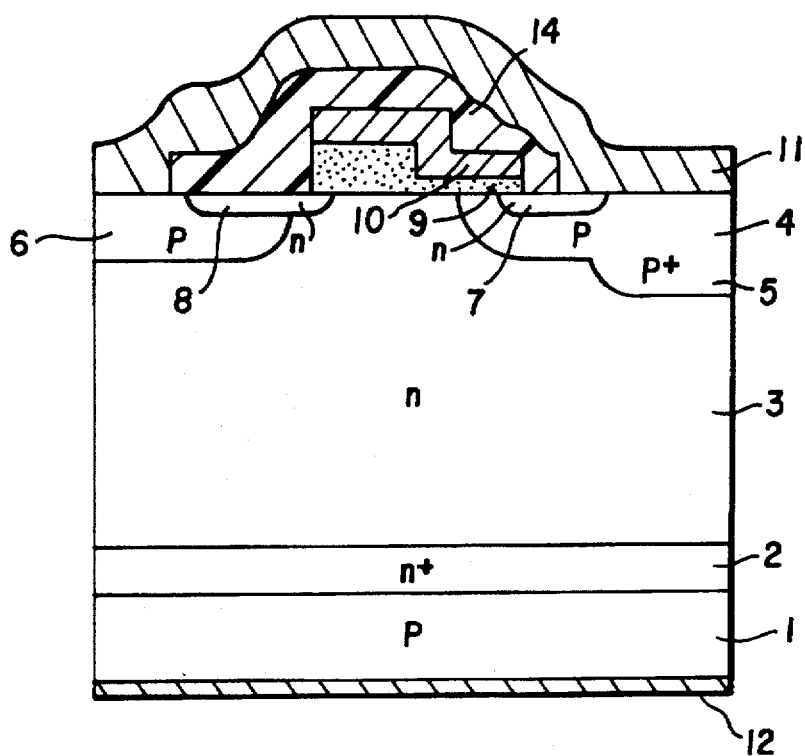
FIG. 16 is a fragmentary cross sectional view showing another improved EST.

The graph of FIG. 6 indicates a voltage-current relationship to show results of measurements of the reverse bias safe operation areas (RBSOA) of the insulated gate thyristor shown in FIG. 1 as the first embodiment of the present invention, ESTs as comparative examples, including EST-1 as shown in FIG. 14, EST-2 as shown in FIG. 15 and EST-3 as shown in FIG. 16, and an IGBT as another comparative example. The RBSOA was measured at 125° C. with a measuring circuit as shown in FIG. 7. In the graph of FIG. 6, The axis of abscissa indicates a voltage between the anode and the cathode, and the axis of ordinates indicates electric current. In FIG. 7, a device 21 to be measured was connected to a dc power supply 24, through a 1 mH inductor 22 and a free-wheeling diode 23 connected in parallel with the inductor 22, and a gate of the device 21 was connected to a gate power supply 26, through a resistor 25 of 20Ω. The device 21 was produced as a 600V-class device, using a wafer comprised of the n⁺ buffer layer 2 in the form of a 10 μm-thickness n layer having a resistivity of 0.1Ω.cm, and the n base layer 3 in the form of a 55 μm-thickness n layer having a resistivity of 40Ω.cm, which were epitaxially grown on a 450 μm-thickness p type silicon substrate having a resistivity of 0.02 μm. The n emitter region 8 and the n source region 7 had the width of 6 μm and 4 μm, respectively. The width of the n emitter region 8 of EST-2 and EST 3 was 20 μm. All of the five devices of FIGS. 1, 14, 15 and 16 and IGBT had a chip size of 1 cm². The ON-state voltage, which was defined by a fall of potential occurring when a current of 100A is conducted through the relevant device, was 0.9 V for the insulated gate thyristor of the present invention, 1.6 V for the EST-1, 1.7V for the EST-2, 1.0V for the EST-3, and 2.3 V for the IGBT. It will be understood from FIG. 6 that the device of the first embodiment of the present invention has a lower ON-state voltage as compared with the other four devices, and the safe operation areas indicate that the breakdown withstand capability of the device of the invention is three times as high as that of the IGBT and twice as high as that of the ESTs. Thus, the ON-state voltage can be lowered without affecting other characteristics. This is because the proportion of the area of the thyristor portion is increased with an increase in the length of the n emitter region 8, and the pn junction between the n emitter region 8 and the second p base region 6 can resume its reverse-blocking ability uniformly over the entire length thereof, with the second p base region 6 functioning as a bypass of the hole current.

Figure 3:
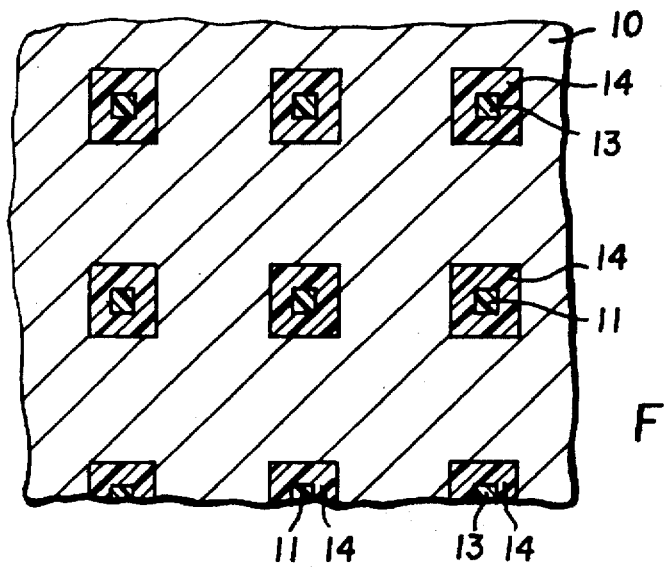
FIG. 3 is a cross sectional view taken along a horizontal plane extending through the middle of a gate electrode of an insulated gate thyristor as the Second embodiment of the present invention.

FIG. 3 is a cross sectional view of an insulated gate thyristor as the second embodiment of the present invention, as taken in a plane extending through the middle of the gate electrode 10. In this insulated gate thyristor, the first p base region 4 and the n source region 7 as a part of its surface layer, and the second p base region 6 and the n emitter region 8 as a part of its surface layer are formed through Square holes provided in the gate electrode 10. In FIG. 3, there are shown cathodes 11 each of which contacts a surface of the corresponding n source region 7, through a contact hole formed through the insulating film 14 deposited on the upper and side faces of the gate electrode 10, and also shown polycrystalline silicon films 13 each of which contacts a surface of the corresponding second p base region 6, through a contact hole formed through the insulating film 14.

Figure 4:
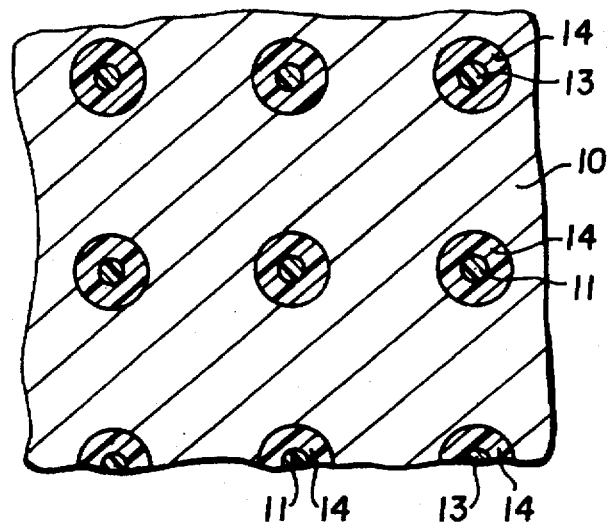
FIG. 4 is a cross sectional view taken along a horizontal plane extending through the middle of a gate electrode of an insulated gate thyristor as the third embodiment of the present invention.

FIG. 4 is a cross sectional view of an insulated gate thyristor according to the third embodiment of the present invention, as taken in a plane extending through the middle of the gate electrode 10. In this insulated gate thyristor, the first p base region 4 and the n source region 7 as a part of its surface layer, and the second p base region 6 and the n emitter region 8 as a part of its surface layer are formed through circular holes provided in the gate electrode 10. This embodiment differs from the second embodiment of FIG. 3 only in respect of its pattern or shape of the holes, and the arrangement of the gate electrode 10, cathode 11, polycrystalline silicon film 13 and insulating film 14 of this embodiment is the same as that of the second embodiment.

Figure 5:
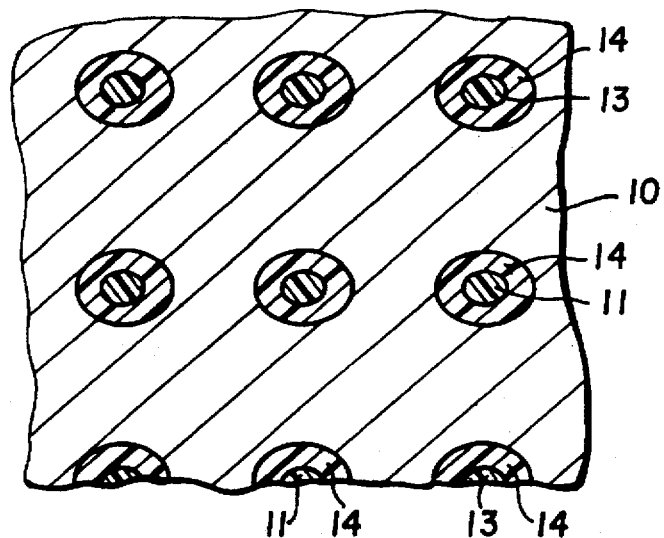
FIG. 5 is a cross sectional view taken along a horizontal plane extending through the middle of a gate electrode of an insulated gate thyristor as the fourth embodiment of the present invention.

FIG. 5 is a cross sectional view of an insulated gate thyristor according to the fourth embodiment of the present invention, as taken in a plane extending through the middle of the gate electrode 10. In this insulated gate thyristor, the first p base region 4 and the n source region 7 as a part of its surface layer, and the second p base region 6 and the n emitter region 8 as a part of its surface layer are formed through elliptic holes provided in the gate electrode 10. This embodiment differs from the second and third embodiments of FIGS. 3 and 4 only in respect of its pattern or shape of the holes, and the arrangement of the gate electrode 10, cathode 11, polycrystalline silicon film 13 and insulating film 14 of this embodiment is the same as that of those embodiments.

The ON-state voltage and the RBSOA of each of the insulated gate thyristors of FIGS. 3, 4 and 5 were measured, using the circuit of FIG. 7. As seen in TABLE 1 indicating the results of the measurements, all of these thyristors exhibited relatively low ON-state voltages of around 0.85 V, and large RBSOAs of 1000A or greater. As in the insulated gate thyristor of the first embodiment, the devices of FIGS. 3, 4 and 5 provide such low ON-state voltages and large RBSOAs because the pn junction between the n emitter region 8 and the second p base region 6 can resume its reverse-blocking ability uniformly over the entire length thereof, and the second p base region 6 functions as a bypass of the hole current. TABLE 1 also indicates results of the same measurements with respect to insulated gate thyristor having cells with hexagonal, octagonal and dodecagonal holes formed through the gate electrodes 10 for forming the first p base region 4 and the n source region in its surface layer, and the second p base region 6 and the n emitter region 8 in its surface layer. As seen in TABLE 1, all of these thyristors exhibited low ON-state voltages of around 0.84 V, and large RBSOAs of 1000A or greater. The width of the n source region of each cell was 4 µm, and the width of the n emitter region was 10 µm. The ON-state voltage is considered as a level (V) at 100Acm$^{-2}$, and the RBSOA is considered as a level (A) when the voltage $V_{AK}$ between the anode and the cathode is 500V.

TABLE 1

| Cell shape | Square | Hexa-gon | Octa-gon | Dodeca-gon | Circle | Ellipse |
| --- | --- | --- | --- | --- | --- | --- |
| (Volt) ON-state voltage | 0.85 | 0.84 | 0.84 | 0.84 | 0.85 | 0.88 |
| (Ampere) RBSOA | 1010 | 1001 | 1015 | 1015 | 1018 | 1000 |

Figure 8:
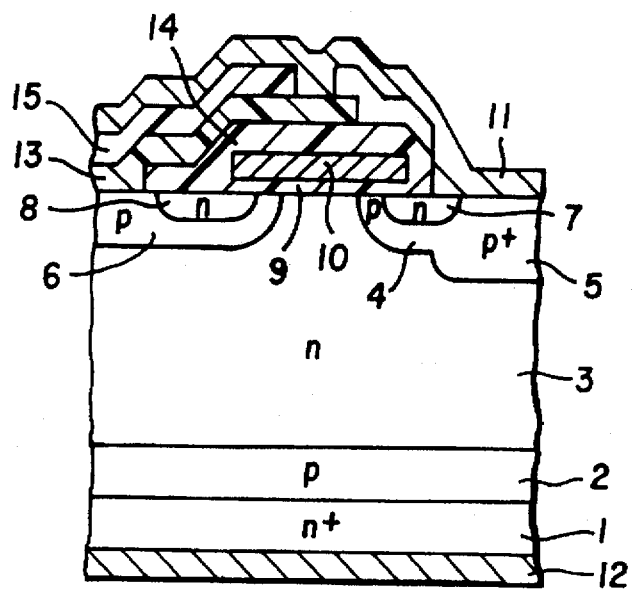
FIG. 8 is a fragmentary cross sectional view of an insulated gate thyristor of the fifth embodiment of the present invention.

FIG. 8 is a fragmentary cross sectional view of an insulated gate thyristor according to the fifth embodiment of the present invention. In this embodiment, an insulating film 15 consisting of a 0.7 µm-thickness silicon oxide film is disposed between the polycrystalline silicon film 13 and the cathode 11, and a contact area between the polycrystalline silicon film 13 and the cathode 11 is located above an exposed portion of the (upper) surface of the n base layer 3. Thus, the location of the contact area between the polycrystalline silicon film 13 an the cathode 11 may be freely selected.

Figure 9:
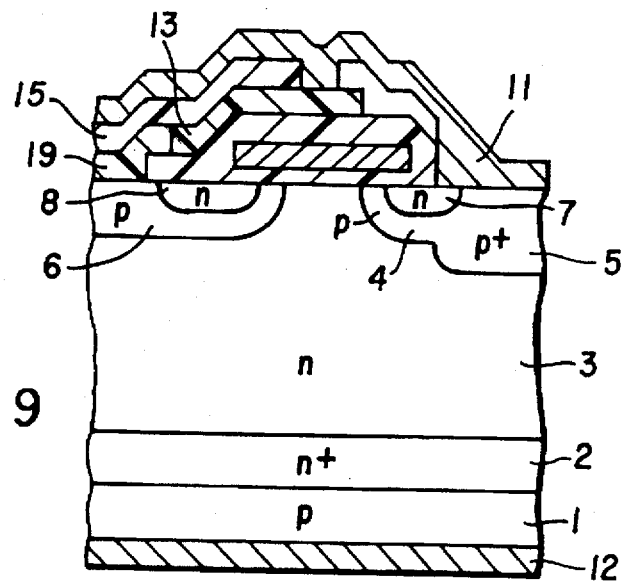
FIG. 9 is a fragmentary cross sectional view of an insulated gate thyristor of the sixth embodiment of the present invention.

FIG. 9 is a fragmentary cross sectional view of an insulated gate thyristor according to the sixth embodiment of the present invention. In this embodiment, a polycrystalline silicon layer provides a diode consisting of a p type polycrystalline silicon film 19 and an n type polycrystalline silicon film 13.

As in the insulated gate thyristor of the first embodiment, these devices of FIGS. 8 and 9 provide relatively low ON-state voltages and large RBSOAs, since the pn junction between the n emitter region 8 and the second p base region 6 can resume its reverse-blocking ability uniformly over the entire length thereof, and the second p base region 6 functions as a bypass of the hole current.

Figure 10:
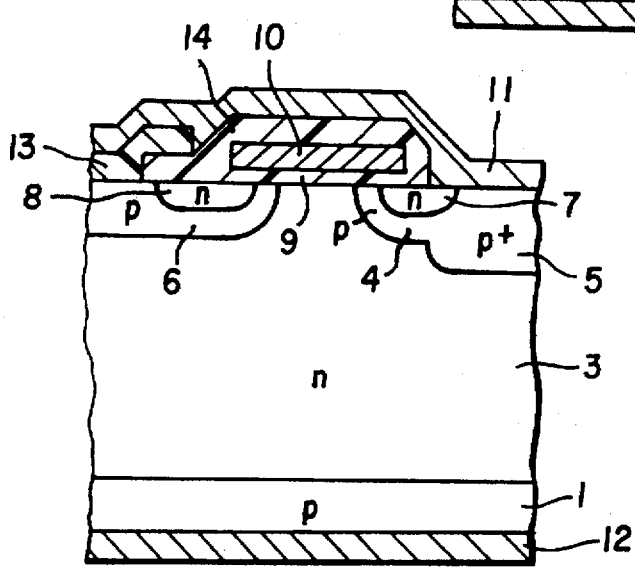
FIG. 10 is a fragmentary cross sectional view of an insulated gate thyristor of the seventh embodiment of the present invention.

While the n$^+$ buffer layer 2 is provided between the p emitter layer 1 and the n base layer 3 in any of the devices of the illustrated embodiments, the present invention is equally applicable to a device having no n$^+$ buffer layer 2. FIG. 10 is a fragmentary cross sectional view of an insulated gate thyristor according to the seventh embodiment of the present invention, which is produced using a bulk silicon wafer. While the structure on one of major surfaces of the n base layer 3 consisting of the bulk silicon wafer is the same as that of the first embodiment of FIG. 1, the present embodiment differs from the first embodiment in that the p emitter layer 1 is directly formed on the other surface of the n base layer 3.

Figure 11:
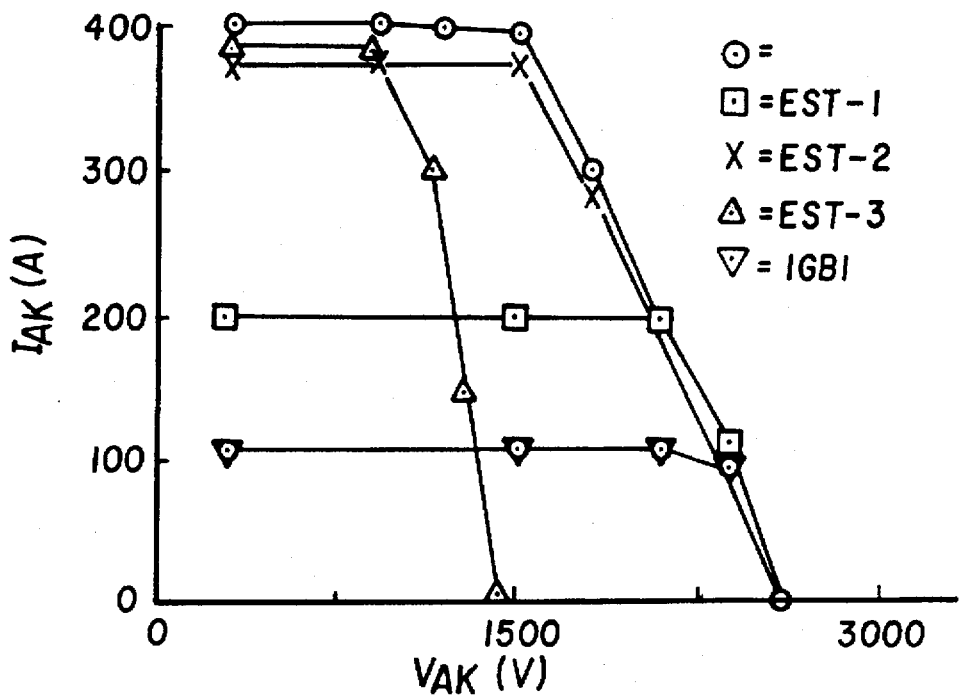
FIG. 11 is a graph showing the RBSOAs of 2500V-class devices of the seventh embodiment of the present invention and comparative examples.

The graph of FIG. 11 shows results of measurements of the reverse bias safe operation areas (RBSOA) as measured at 125° C. with respect to 2500V-class devices of the insulated gate thyristor of FIG. 10 as the seventh embodiment of the present invention, and EST-1 of FIG. 14, EST-2 of FIG. 15, EST-3 of FIG. 16, and an IGBT as comparative examples. In the graph of FIG. 11, the axis of abscissa indicates voltage between the anode and the cathode, and the axis of ordinates indicates an electric current. The thickness of the n base layer 3 was 440 µm. The ON-state voltages of these five devices were 1.1V, 2.0V, 2.2V, 1.4V and 3.3V, respectively. Thus, the device of the present invention using the bulk wafer, as well as the above-indicated 600V-class device using an epitaxial wafer, provided a significantly larger RBSOA and a relatively low ON-state voltage, as compared with those of the ESTs and IGBT. Namely, the effects of the present invention do not vary depending upon the resistivity of the n base layer 3 and the current amplification factor of the pnp wide base transistor, and the RBSOA can be significantly increased without even slightly increasing the ON-state voltage. In other words, the present invention is effective to reduce the ON-state voltage and increase the RBSOA, without regard to a rated voltage of the device, and a method of producing a semiconductor crystal of the substrate of the device.

Figure 12:
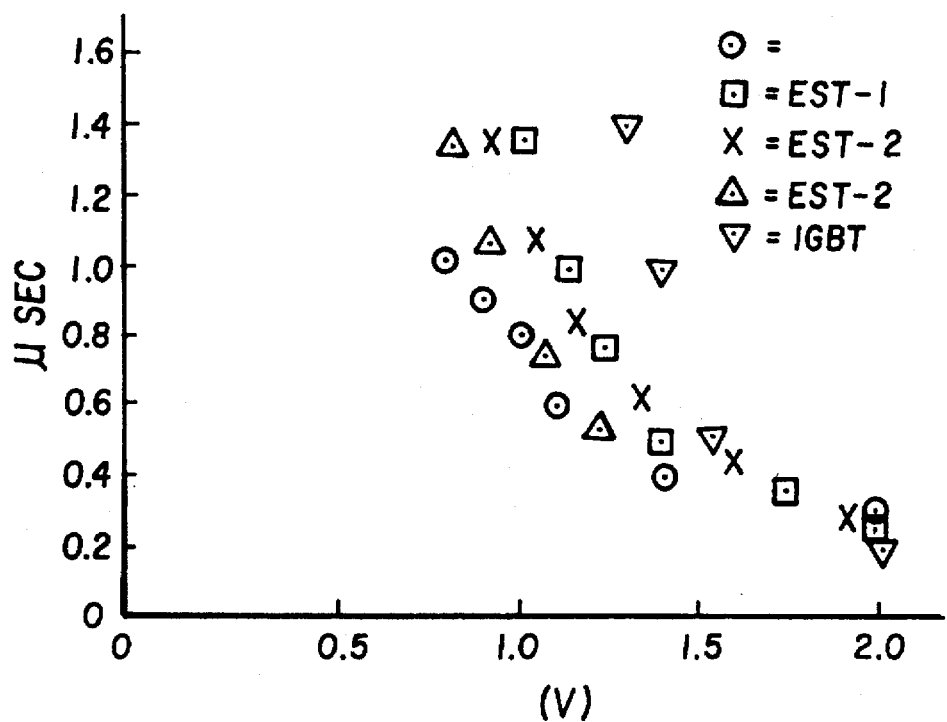
FIG. 12 is a graph showing trade-off characteristics between the ON-state voltage and turn-off time of the 600V-class devices of the first embodiment of the present invention and comparative examples.
Figure 13:
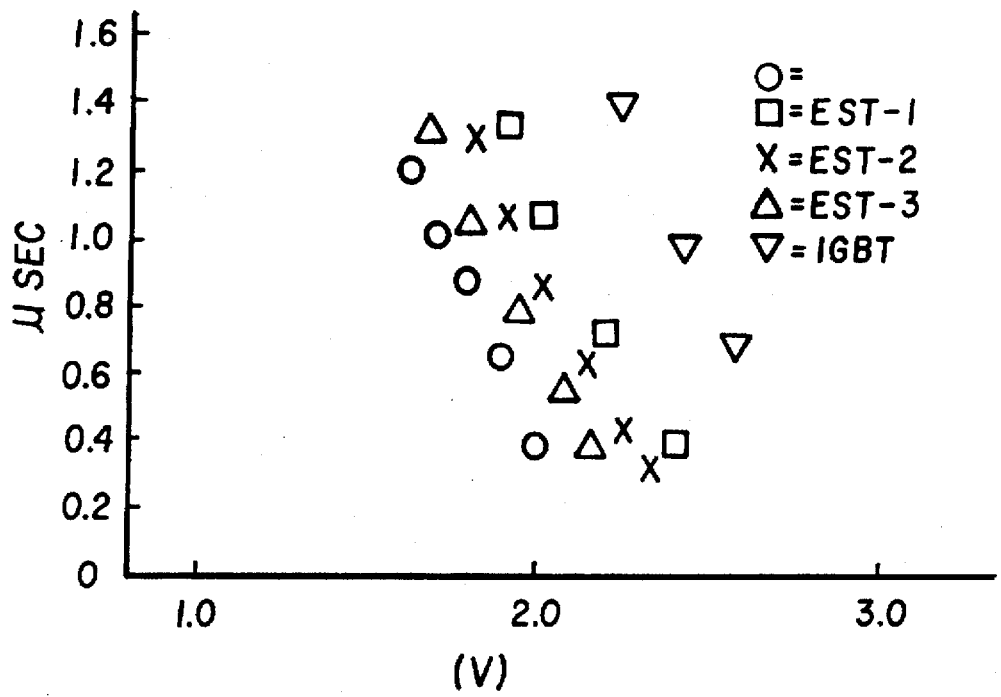
FIG. 13 is a graph showing trade-off characteristics between the ON-state voltage and turn-off time of the 2500V-class devices of the seventh embodiment of the present invention and comparative examples.

The graph of FIG. 12 shows a trade-off characteristic between the ON-state voltage and turn-off time of the 600V-class devices as described above, and the graph of FIG. 13 shows a trade-off characteristic between the ON-state voltage and turn-off time of the 2500-class devices. The axis of abscissa indicates the ON-state voltage, and the axis of ordinates indicates the turn-off time. The ON-state voltage was indicated by a fall of potential occurring at 25° C. when a current of 100A/cm$^2$ was conducted through the 600V-class device, or when a current of 50A/cm$^2$ was conducted through the 2500V-class device. The turn-off time was measured at 125° C. It is found that in either case, the device of the present invention exhibits a better trade-off characteristic than the ESTs and IGBT.

Although the first and second conductivity types are n type and p type, respectively, in the illustrated embodiments, these conductivity types may be reversed, namely, the first conductivity type may be p type and the second conductivity type may be n type.

In the conventional EST, the thyristor is shifted from the IGBT mode into the latch-up state, utilizing a fall of potential induced by the current flowing in the Z direction. According to the present invention, on the other hand, a first-conductivity-type semiconductor film is provided between a main electrode and a second second-conductivity-type base region, to cooperate with the second-conductivity type base region to form a diode, and a diffusion potential difference of this diode is utilized to allow the pn junction to recover its reverse-blocking ability uniformly over its entire length, upon turn-off of the device. Thus, the voltage-driven type insulated gate thyristor provides a larger reverse bias safe operation area and exhibits a better trade-off characteristic than the EST and IGBT, in a wide voltage withstand range from 600V class to 2500V class.

The invention has been described in detail with reference to certain preferred embodiments thereof. It will be understood, however, that modifications and variations are possible within the scope of the appended claims.

What is claimed is:

1. An insulated gate thyristor comprising:
    a first-conductivity-type base layer of high resistivity;

first and a second second-conductivity-type base regions formed in spaced-apart selected areas of a surface layer of a first major surface of said first-conductivity-type base layer;

a first-conductivity-type source region formed in a selected area of a surface layer of said first second-conductivity-type base region;

a first-conductivity-type emitter region formed in a selected area of a surface layer of said second second-conductivity-type base region;

a gate electrode formed on an insulating film, wherein said insulating film is formed on exposed portions of said first second-conductivity-type base region, said first-conductivity-type base layer, and said second second-conductivity-type base region, said exposed portions being interposed between said first-conductivity-type source region and said first-conductivity-type emitter region;

a first main electrode in contact with both an exposed portion of said first second-conductivity-type base region and said first-conductivity-type source region;

a first-conductivity-type semiconductor film interposed between said first main electrode and an exposed portion of said second second-conductivity-type base region, said first-conductivity-type semiconductor film cooperating with said second second-conductivity-type base region to form a diode;

a second-conductivity-type emitter layer formed on a second major surface of said first-conductivity-type base layer; and a second main electrode in contact with said second-conductivity-type emitter layer.

2. An insulated gate thyristor as defined in claim 1, wherein a contact area between said second second-conductivity-type base region and said first-conductivity-type semiconductor film has one of polygonal, circular and elliptical shapes.

3. An insulated gate thyristor as defined in claim 1, wherein said first-conductivity-type semiconductor film is formed of polycrystalline silicon.

4. An insulated gate thyristor as defined in claim 1, wherein a contact area between said first main electrode, and said first second-conductivity-type base region and said first-conductivity-type source region has one of polygonal, circular and elliptical shapes.

5. An insulated gate thyristor comprising:

a first-conductivity-type base layer of high resistivity;

a first and a second second-conductivity-type base region formed in spaced-apart selected areas of a surface layer of a first major surface of said first-conductivity-type base layer;

a first-conductivity-type source region formed in a selected area of a surface layer of said first second-conductivity-type base region;

a first-conductivity-type emitter region formed in a selected area of a surface layer of said second second-conductivity-type base region;

a gate electrode formed on an insulating film, wherein said insulating film is formed on exposed portions of said first second-conductivity-type base region, said first-conductivity-type base layer, and said second second-conductivity-type base region, said exposed portions being interposed between said first-conductivity-type source region and said first-conductivity-type emitter region;

a first main electrode in contact with both an exposed portion of said first second-conductivity-type base region and said first-conductivity-type source region;

a second-conductivity-type semiconductor film in contact with an exposed portion of said second second-conductivity-type base region;

a first-conductivity-type semiconductor film interposed between said second-conductivity-type semiconductor film and said first main electrode, said first-conductivity-type semiconductor film cooperating with said second-conductivity-type semiconductor film to form a diode;

a second-conductivity-type emitter layer formed on a second major surface of said first-conductivity-type base layer; and a second main electrode in contact with said second-conductivity-type emitter layer.

6. An insulated gate thyristor as defined in claim 5, wherein a contact area between said second second-conductivity-type base region and said second-conductivity-type semiconductor film has one of polygonal, circular and elliptical shapes.

7. An insulated gate thyristor as defined in claim 5, wherein said second-conductivity-type semiconductor film is formed of polycrystalline silicon.

8. An insulated gate thyristor as defined in claim 5, wherein said first-conductivity-type semiconductor film is formed of polycrystalline silicon.

9. An insulated gate thyristor as defined in claim 5, wherein a contact area between said first main electrode, and said first second-conductivity-type base region and said first-conductivity-type source region has one of polygonal, circular and elliptical shapes.

\* \* \* \* \*